(12) United States Patent
Palkar et al.

(10) Patent No.: US 9,006,567 B2
(45) Date of Patent: Apr. 14, 2015

(54) DONOR-ACCEPTOR DYAD COMPOUNDS IN PHOTOVOLTAICS

(75) Inventors: Amit J. Palkar, Bartlesville, OK (US); Ting He, Bartlesville, OK (US)

(73) Assignee: Phillips 66 Company, Houston, TX (US)

( * ) Notice: Subject to any disclaimer, the term of this patent is extended or adjusted under 35 U.S.C. 154(b) by 237 days.

(21) Appl. No.: 13/409,857

(22) Filed: Mar. 1, 2012

(65) Prior Publication Data

US 2013/0056071 A1 Mar. 7, 2013

Related U.S. Application Data

(60) Provisional application No. 61/448,876, filed on Mar. 3, 2011.

(51) Int. Cl.

| | |
|---|---|
| *H01L 51/46* | (2006.01) |
| *H01L 51/48* | (2006.01) |
| *C07D 333/24* | (2006.01) |
| *H01L 51/42* | (2006.01) |
| *B82Y 10/00* | (2011.01) |
| *H01L 51/00* | (2006.01) |

(52) U.S. Cl.
CPC ............. *H01L 51/4253* (2013.01); *B82Y 10/00* (2013.01); *H01L 51/0003* (2013.01); *H01L 51/0026* (2013.01); *H01L 51/0036* (2013.01); *H01L 51/0037* (2013.01); *H01L 51/0047* (2013.01); *H01L 51/0052* (2013.01); *H01L 2251/308* (2013.01); *Y02E 10/549* (2013.01)

(58) Field of Classification Search
None
See application file for complete search history.

(56) References Cited

U.S. PATENT DOCUMENTS

| 6,812,399 B2 | 11/2004 | Shaheen et al. |
|---|---|---|
| 2003/0194630 A1 | 10/2003 | Beck et al. |
| 2010/0137518 A1 | 6/2010 | Yang et al. |
| 2012/0123058 A1* | 5/2012 | Ohno et al. .................. 525/284 |

FOREIGN PATENT DOCUMENTS

| WO | 0184644 | 11/2001 |
|---|---|---|
| WO | 2006018475 | 2/2006 |
| WO | 2008109467 | 9/2008 |

(Continued)

OTHER PUBLICATIONS

Blanchard et al., "Synthesis and Electronic Properties of Adducts of Thiophene-Based p-Conjugated Systems and Fullerene C60," 203 Meeting Symposium, Electrochemical Society, May 2, 2003.*

(Continued)

*Primary Examiner* — Ling Choi
*Assistant Examiner* — Catherine S Branch
(74) *Attorney, Agent, or Firm* — Phillips 66 Company (57) ABSTRACT

Methods, compositions and devices relate to photovoltaic cells having a photoactive layer and constituents synthesized and utilized for the photoactive layer. The photovoltaic cells incorporate photoactive materials produced from dyads formed into an initial layer and then thermally cleaved to provide the photoactive layer. Cleavage of the dyads, such as synthesized fullerene anthracen-2-ylmethyl 3-(thiophen-3-yl) acetate dyads, or polymers of the dyads into separate molecules providing donors and acceptors facilitates in obtaining the photovoltaic cells with desired arrangement and interspacing of the donors and the acceptors relative to one another.

11 Claims, 4 Drawing Sheets

(56) References Cited

FOREIGN PATENT DOCUMENTS

| WO | 2010088419 | | 8/2010 |
| WO | 2010099583 | | 9/2010 |
| WO | WO 2011010526 A1 | * | 1/2011 |

OTHER PUBLICATIONS

Handa et al., "Solid Film versus Solution-Phase Charge-Recombination Dynamics of exTTF-Bridge-C60 Dyads," Chem. Eur. J., 2005, 11, 7440-7447.*

Yamazaki et al., "Synthesis and Electrolytic Polymerization of the Ethylenedioxy-Substituted Terthiophene-Fullerene Dyad," Org. Lett., vol. 6, No. 6, 2004, pp. 4895-4868.*

Roar Sondergaard, Martin Helgesen, Mikkel Jorgensen, and Frederick C. Krebs, "Fabrication of Polymer Solar Cells Using Aqueous Processing for All Layers Including the Metal Back Electrode", Advanced Energy Materials, 2011, vol. 1, pp. 68-71.

Jong Bok Kim, Kathryn Allen, Soong Ju Oh, Stephanie Lee, Michael F. Toney, Youn Sang Kim, Cherie R. Kagan, Colin Nuckolls, and Yueh-Lin Loo, "Small-Molecule Thiophene-C60 Dyads as Compatibilizers in Inverted Polymer Solar Cells", Chemistry of Materials Article, 2010, vol. 22, pp. 5762-5773.

"PCT Notification of Transmittal of the International Search Report and the Written Opinion of the International Searching Authority, or the Declaration", International Filing Date: Mar. 2, 2012, International Application No. PCT/ US2012/027370, 23 pages.

* cited by examiner

DONOR-ACCEPTOR DYAD COMPOUNDS IN PHOTOVOLTAICS

CROSS-REFERENCE TO RELATED APPLICATIONS

This application is a non-provisional application which claims the benefit of and priority to U.S. Provisional Application Ser. No. 61/448,876 filed Mar. 3, 2011, entitled "Donor-Acceptor DYAD Compounds in Photovoltaics," which is hereby incorporated by reference in its entirety.

FIELD OF THE INVENTION

Embodiments of the invention relate to compounds and use thereof in a photoactive layer of organic photovoltaic cells that generate electricity.

BACKGROUND OF THE INVENTION

Photovoltaic cells convert sunlight into electricity providing an alternative energy source. High costs of silicon based solar panels and difficulties associated with manufacturing such panels limit commercial success of this technology. Organic photovoltaic cells by comparison offer advantages with respect to economical cost, weight and flexibility.

The organic photovoltaic cells operate by light being absorbed at an active layer of the cell that includes molecules or compound moieties that define donors and acceptors. When photons are absorbed, photo-induced electron transfers take place from the donors to the acceptors leading to electron-hole pairs that can be harnessed to generate the electricity. However, proximity of the donors to the acceptors influences this charge transfer in a manner that limits conversion efficiencies obtainable with prior devices.

In past approaches to provide the active layer, blends of polymeric donor compounds and fullerene acceptor compounds tend to phase segregate during manufacturing of the photovoltaic cells preventing desirable intimate mixing thereof. Further, dyad compounds that include both acceptor moieties and donor moieties tend to lack sufficient separation thereof to prevent unwanted recombination of electrons and holes within the active layer. Complexity in synthesis of such dyads also contributes to expense of the cell.

Therefore, a need exists for compounds and their use in a photoactive layer to produce solar panels having beneficial attributes.

BRIEF SUMMARY OF THE DISCLOSURE

In one embodiment, a method includes depositing a first electrode and a second electrode to provide a photovoltaic cell with a photoactive layer disposed between the first and second electrodes. The method further includes forming the photoactive layer with a donor and an acceptor by depositing a dyad having a first moiety linked by a chemical bond to a second moiety. Once deposited, cleaving the chemical bond of the dyad between the first moiety that provides the donor and the second moiety that provides the acceptor controls arrangement and interspacing of the donor and the acceptor relative to one another.

According to one embodiment, a compound comprises a fullerene anthracen-2-ylmethyl 3-(thiophen-3-yl) acetate dyad. The dyad may define a repeating monomer unit in a polymer. Further, fabrication of a photovoltaic cell may utilize the dyad that is cleaved to provide a controlled arrangement and interspacing of an acceptor and a donor.

For one embodiment, a device includes a first electrode, a second electrode and a photoactive layer. The photoactive layer includes a donor and an acceptor and is disposed between the first and second electrodes to provide a photovoltaic cell. The donor and the acceptor provide a controlled arrangement and interspacing relative to one another based on separation at a cleaved chemical bond, which before cleavage linked within a dyad a first moiety that provides the donor with a second moiety that provides the acceptor.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Embodiments of the invention relate to compounds and their use in a photoactive layer to produce photovoltaic cells. The photovoltaic cells incorporate photoactive materials produced from dyads formed into an initial layer and then thermally cleaved to provide the photoactive layer. Cleavage of the dyads, such as synthesized fullerene anthracen-2-ylmethyl 3-(thiophen-3-yl) acetate dyads, or polymers of the dyads into separate molecules providing donors and acceptors facilitates in obtaining the photovoltaic cells with desired arrangement and interspacing of the donors and the acceptors relative to one another.

Figure 1:
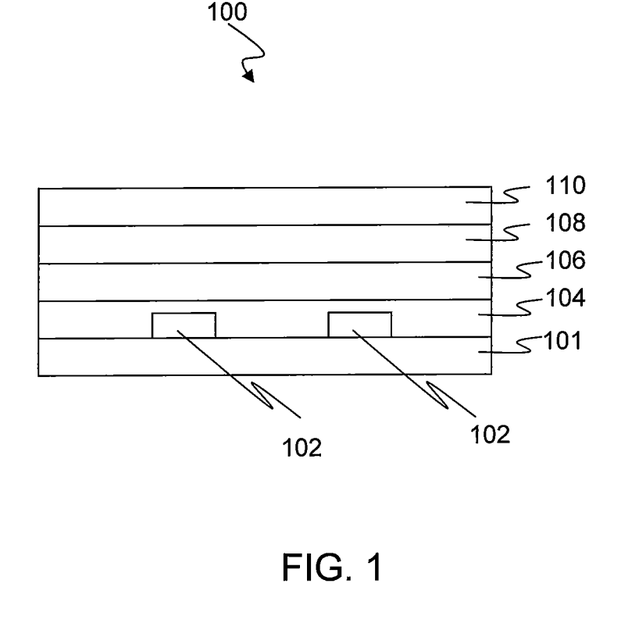
FIG. 1 is a schematic side view of an exemplary photovoltaic cell incorporating photoactive materials including thermally cleaved dyads, according to embodiments of the invention.

FIG. 1 illustrates an exemplary configuration of a photovoltaic cell 100 that includes a substrate 101, a first electrode 102 (depicted as two parallel strips), a first interfacial layer 104, a photoactive layer 106, a second interfacial layer 108 and a second electrode 110. The photoactive layer 106 contains the photoactive materials as described herein. While described with reference to general aspects provided by the photovoltaic cell 100, various other photovoltaic cell configurations different from the exemplary configuration of the photovoltaic cell 100 may employ the photoactive materials in a corresponding manner between an anode and a cathode.

Fabricating the photovoltaic cell 100 utilizes deposition techniques such as spin-casting and vapor deposition to form respective components of the photovoltaic cell 100 on the substrate 101, such as glass. Depositing the first electrode 102 on the substrate 101, the first interfacial layer 104 on the first electrode 102, the photoactive layer 106 on the first interfacial layer 104, the second interfacial layer 108 on the photoactive layer 106 and the second electrode 110 on the second interfacial layer 108 disposes the photoactive layer 106 between the first electrode 102 that functions as an anode and the second electrode 110 that functions as a cathode. Common examples of the first electrode 102, the first interfacial layer 104, the second interfacial layer 108 and the second electrode 110 include respective compositions of indium tin oxide (ITO), semiconducting poly(3,4-ethylenedioxythiophene):poly(styrenesulfonate) (PEDOT:PSS), lithium fluoride (LiF) and aluminum (Al).

Forming the photoactive layer 106 includes depositing dyads each having a first moiety linked by a chemical bond to a second moiety. After the dyads are deposited, arrangement and interspacing of donors and acceptors relative to one another within the photoactive layer 106 is controlled by cleaving the chemical bonds of the dyads between the first moieties that provide the donors and the second moieties that provide the acceptors. Since the photoactive layer 106 contains both the donors and acceptors, the interfacial layers 104, 108 facilitate charge transfer to the electrodes 102, 110 by providing such properties as electron or electron-hole blocking, electron or electron-hole transporting and surface planarization.

In operation, light passes through the substrate 101, the first electrode layer 102 and the first interfacial layer 104 that are all transparent. The donors and acceptors in the photoactive layer 106 then absorb the light. When the donors and acceptors are excited by the light, a photo-induced current across the electrodes 102, 110 occurs as result of the donors in the photoactive layer 106 acting as a transporter of electron-holes to the first electrode 102 along with the acceptors acting as a transporter of electrons to the second electrode 110. The arrangement and interspacing of donors and acceptors that is controlled as set forth herein promotes desired interfaces between the donors and acceptors and limits problems from recombination of electrons and electron-holes in the photoactive layer 106.

Figure 2:
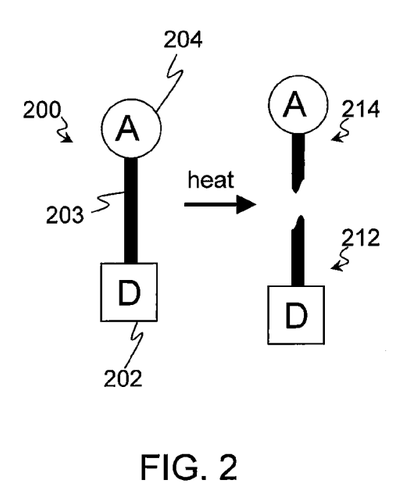
FIG. 2 is a schematic depiction of thermal cleavage of a linker portion for one of the dyads illustrated as a monomer, according to embodiments of the invention.

FIG. 2 depicts a dyad 200 as deposited onto the first interfacial layer 104 shown in FIG. 1. A first moiety 202 chemically bound by a linker 203 to a second moiety 204 all form the dyad 200. After the dyad 200 is deposited onto the first interfacial layer 104, heating the dyad 200 breaks a chemical bond of the linker 203 causing thermal cleavage of the dyad 200 into a donor 212 and an acceptor 214. In some embodiments, applying electromagnetic energy to the dyad 200 deposited causes the chemical bond of the linker 203 to break.

The first moiety 202 thus provides the donor 212. Likewise, the second moiety 204 provides the acceptor 214. In some embodiments, the linker 203 includes an ester group such that the chemical bond cleaved by heat is at the ester group of the dyad 200. Without decomposing the first moiety 202 or any optional polymerization of the donor 212, the heating of the dyad 200 occurs in some embodiments to above 50° C., above 100° C. or between 150° C. and 450° C.

For some embodiments, the first moiety 202 and hence the donor 212 include thiophene, arylenevinylene, fluorene, carbazole, indolo-carbazole, polyselenophene, dithieneopyrrole, benzodithiophene and combinations or copolymers thereof. Such examples of photoactive groups included in the first moiety 202 conduct electron holes as required by the donor 212 during operation. The second moiety 204 and thereby the acceptor 214 include a fullerene such as $C_{60}$ or fullerenes from $C_{40}$ to $C_{200}$, in some embodiments. The fullerenes function as the acceptor 214 due to ability to accept multiple electrons. The second moiety 204 may include the fullerenes functionalized for solubility and/or that are doped with nitrogen, metal and tri-metallic nitride, for example.

In addition, the donor 212 and the acceptor 214 each include R-groups from portions of the linker 203 that remain following the cleavage of the dyad 200. The linker 203 may include a fullerene reactive group, such as anthracene, for coupling the first moiety 202 with the second moiety 204. The acceptor 214 may therefore include the anthracene bound to the fullerene, for example.

In some embodiments, synthesis of the dyad 200 relies on esterification of precursors to form an intermediate of the first moiety 202 and the linker 203 bound together. The fullerene reactive group of the linker 203 that has an alcohol side chain (e.g., methanol) and the photoactive group included in the first moiety 202 and having acid functionality (e.g., an acetic acid side chain) provide examples of the precursors. A solution of the precursors in a first solvent (e.g., pyridine or dicholoromethane) mixes with a coupling agent (e.g., 2-chloro-3,5 dinitropyridine, dicyclohexylcarbodiimide and dimethylaminopyridine or dicycloisopropylcarbodiimide and dimethylaminopyridine) to produce the intermediate.

Reaction of the intermediate with the second moiety 204 to produce the dyad 200 may then occur by Diels-Alder coupling. Such coupling occurs by heating a solution of the second moiety 204 and the intermediate within a second solvent (e.g., carbon disulfide ($CS_2$), toluene or o-dichlorobenzene). The heating raises temperature of the solution of the second moiety 204 and the intermediate to above 25° C. or up to a boiling point of the second solvent.

Figure 3:
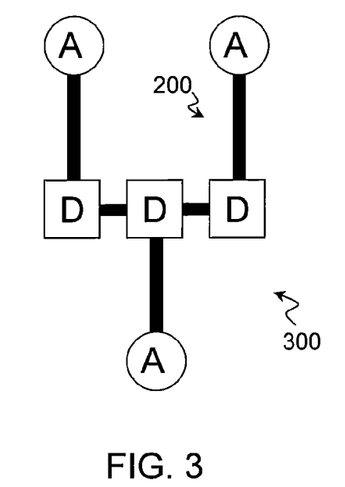
FIG. 3 is a schematic representing the dyads as monomer units of an oligomer and prior to the cleavage, according to embodiments of the invention.

FIG. 3 shows the dyad 200 as a monomer unit of an oligomer 300 and prior to cleavage illustrated in FIG. 2. In some embodiments, a monomer reactant for synthesis of the oligomer 300 includes the dyad 200 shown in FIG. 2 with two halogen atoms (e.g., bromine (Br)) on the first moiety 202. Abstraction of the halogen atoms results in joining a plurality of such monomer reactants together by chemical bonds at respective donor moieties.

Figure 4:
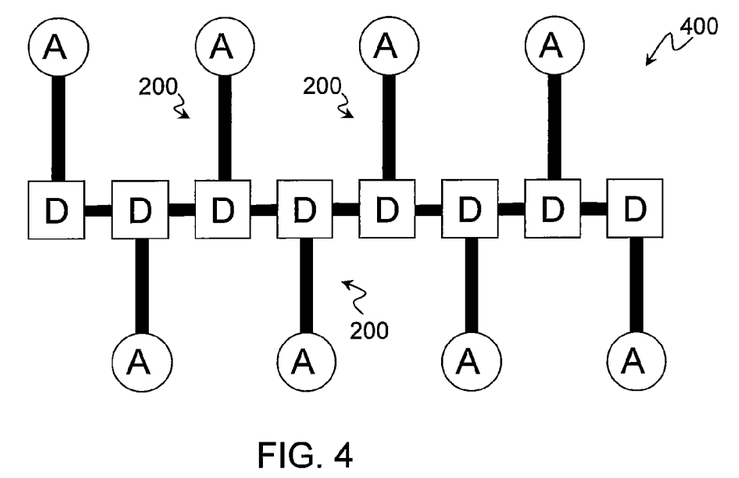
FIG. 4 is a schematic representing the dyads as monomer units of a polymer and prior to the cleavage, according to embodiments of the invention.

FIG. 4 illustrates the dyad 200 as a monomer unit of a polymer 400 and prior to cleavage illustrated in FIG. 2. As used herein, the polymer 400 refers to a compound composed of at least two repeating monomer units and thus is inclusive of the oligomer 300, which refers to a compound composed of between two and ten repeating monomer units. Analogous techniques used to produce the oligomer 300 therefore enable production of the polymer 400.

Depositing the dyad 200 during forming of the photoactive layer 106 shown in FIG. 1 utilizes monomers, oligomers and/or polymers formed of the dyad 200 as shown in FIGS. 2-4. With reference to FIGS. 3 and 4, heating the oligomer 300 or the polymer 400 to break the monomer units as shown in FIG. 2 occurs after the oligomer 300 or the polymer 400 is deposited onto the first interfacial layer 104 shown in FIG. 1. A resulting donor therefore remains polymerized with repeating photoactive groups bound together upon such chemical bonds being broken while still achieving benefits of controlled arrangement and interspacing of resulting donors and acceptors. The resulting donor being polymerized in a final useable form of the photoactive layer 106 may alter an absorbance spectrum of the donor toward desirable wavelengths.

A sample prepared demonstrated concepts presented herein. The sample synthesized by a process set forth produced fullerene anthracen-2-ylmethyl 3-thiophen-3-yl) acetate dyads. Compound 1 shows a structure of one such dyad and formula that is:

Compound 1

Figure 5:
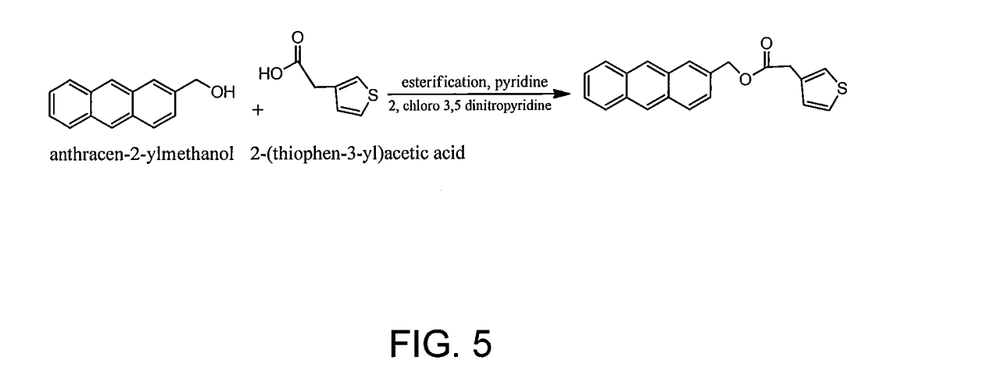
FIG. 5 is a first reaction to produce intermediates in a process to synthesize exemplary compounds suitable for use as the dyads, according to embodiments of the invention.

FIG. 5 shows a first reaction that produced intermediates in the process to synthesize the sample. A precursor mixture was prepared by adding 1.168 grams of anthracen-2-yl methanol (5.6 mmol) and 0.673 grams of 2-(thiophen-3-yl)acetic acid (4.7 mmols) to a dry flask. Next, 20 ml of pyridine used as a first solvent was transferred to the flask. The precursor mixture was stirred until completely dissolved in the pyridine to provide a first solution. Drop-wise addition of 0.816 grams of 2-chloro-3, 5 dinitro pyridine (4.7 mmols) was added to the first solution and acted as a condensing agent. A subsequent mixture was stirred and refluxed at 115° C. for 30 minutes under argon atmosphere. After cooling down to room temperature and evaporating the pyridine using a rotary evaporator, solids were reconstituted using 20 ml of ethyl acetate for transfer into a 6% sodium bicarbonate solution, extracted twice with ethyl acetate (2×200 ml), and dried over anhydrous sodium sulfate. An extract was evaporated to near dryness and transferred on to a 5 cm by 30 cm silica column prepared using 1:9 ethyl acetate/hexane mixtures. The intermediates were collected as pure anthracene-2-ylmethyl 3-(thiophen-3-yl) acetate by slow elution using 1:9 ethyl acetate/hexane mixtures.

Figure 6:
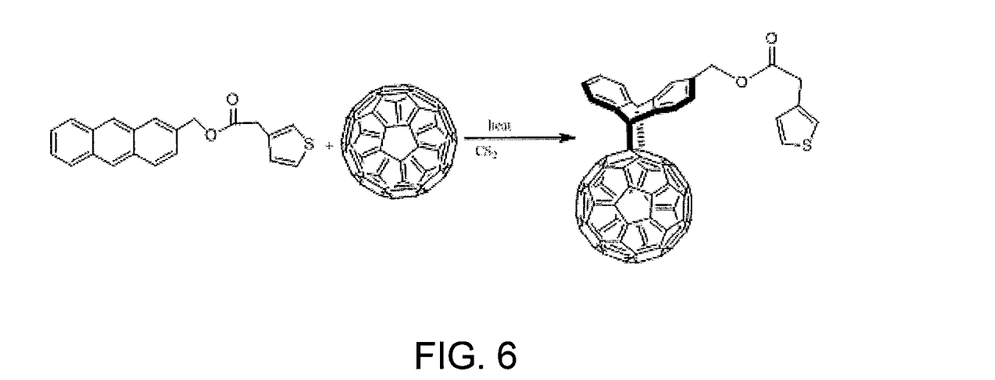
FIG. 6 is a second reaction between the intermediates and fullerenes for synthesis of the exemplary compounds, according to embodiments of the invention.

FIG. 6 illustrates a second reaction between the intermediates and fullerenes in the process that synthesized the sample. A second solution was prepared by mixing 191 milligrams of the fullerenes (0.8 mmols) with 50 ml of carbon disulfide used as a second solvent and 81 milligrams of the intermediates (0.8 mmol) and was refluxed at 40° C. for 48 hours under argon atmosphere. The carbon disulfide was evaporated and products were transferred to a silica column prepared using carbon disulfide. The column was first eluted using carbon disulfide where excess unreacted fullerene eluted from the column as a violet band. The eluent was then changed to toluene where the Compound 1 eluted as a brown band. Excess toluene was evaporated and the Compound 1 was washed with diethyl ether.

Figure 7:
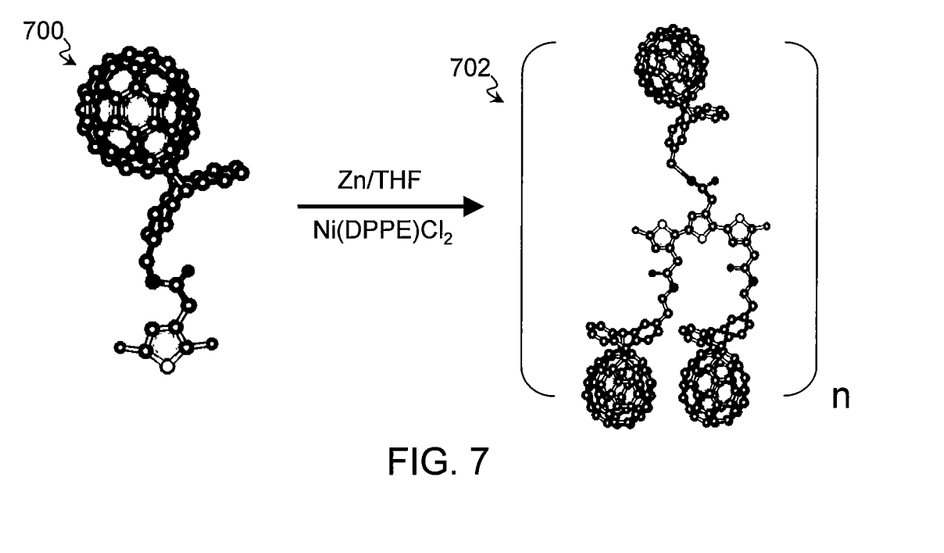
FIG. 7 is a third reaction to achieve polymerization of the exemplary compounds, according to embodiments of the invention.

FIG. 7 shows an example of a third reaction to achieve dyad polymerization. A process as shown in FIGS. 5 and 6 except using 2-(2,5-dibromo-thiophen-3-1)acetic acid instead of the 2-(thiophen-3-yl)acetic acid in the precursor mixture may provide monomer reactants 700 for the polymerization. Treatment of the monomer reactants 700 with zinc (Zn) and tetrahydrofuran (THF) yields organometallic isomers in which further treatment with 1,2-Bis(diphenylphosphino) ethane nickel(II) chloride (Ni(DPPE)Cl$_2$) produces a polymeric product 702 with dyad monomer units.

Figure 8:
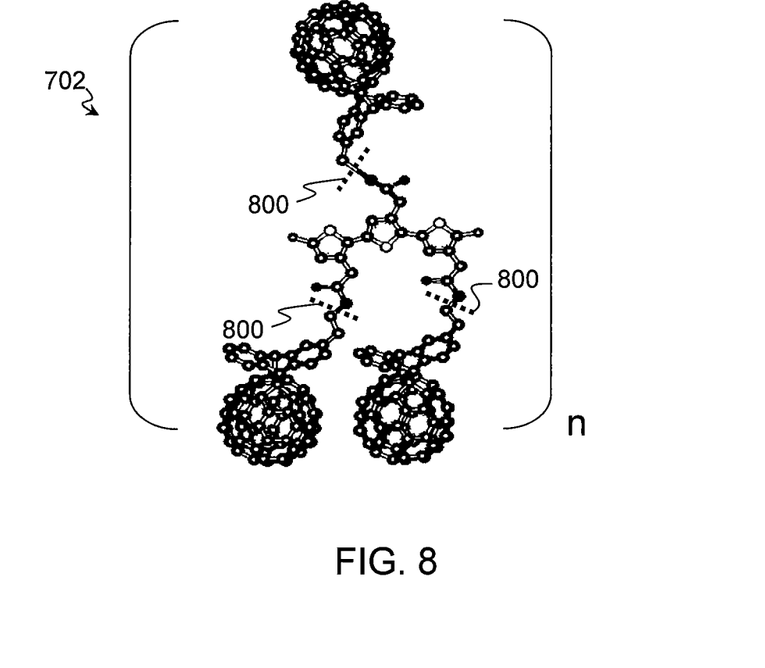
FIG. 8 is a fourth reaction showing the thermal cleavage that occurs after the exemplary compounds that are polymerized have been deposited during manufacture of the photovoltaic cell, according to embodiments of the invention.

FIG. 8 illustrates an example of a fourth reaction showing thermal cleavage of the polymeric product 702 shown in FIG. 7. As described herein, the cleavage occurs after the polymeric product is deposited during photovoltaic cell manufacturing. Dashed lines 800 indicate where chemical bonds are broken due to heating of the polymeric product 702.

In closing, it should be noted that the discussion of any reference is not an admission that it is prior art to the present invention, especially any reference that may have a publication date after the priority date of this application. At the same time, each and every claim below is hereby incorporated into this detailed description or specification as additional embodiments of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:
1. A method comprising:
depositing a first electrode;
forming a photoactive layer with a donor and an acceptor by depositing a dyad having a first moiety linked by a chemical bond to a second moiety, wherein arrangement and interspacing of the donor and the acceptor relative to one another is controlled once deposited by cleaving the chemical bond of the dyad between the first moiety that provides the donor and the second moiety that provides the acceptor; and
depositing a second electrode to provide a photovoltaic cell with the photoactive layer disposed between the first and second electrodes;
wherein the dyad has a formula that is

2. The method according to claim 1, wherein the depositing of the dyad includes deposition of a polymer formed of the dyad as a monomer unit.

3. The method according to claim 1, wherein the depositing of the dyad includes deposition of a polymer formed of the dyad as a monomer unit connected to other monomers via the first moiety such that the donor remains polymerized upon the cleaving of the chemical bond between the first and second moieties of the dyad.

4. The method according to claim 1, wherein heating the dyad deposited causes the cleaving of the chemical bond between the first and second moieties of the dyad.

5. The method according to claim 1, wherein heating the dyad deposited to above 50° C. causes the cleaving of the chemical bond between the first and second moieties of the dyad.

6. The method according to claim 1, wherein the chemical bond cleaved is at an ester group of the dyad.

7. A method comprising:
 depositing a first electrode;
 forming a photoactive layer with a donor and an acceptor by depositing a dyad having a first moiety linked by a chemical bond to a second moiety, wherein arrangement and interspacing of the donor and the acceptor relative to one another is controlled once deposited by cleaving the chemical bond of the dyad between the first moiety that provides the donor and the second moiety that provides the acceptor; and
 depositing a second electrode to provide a photovoltaic cell with the photoactive layer disposed between the first and second electrodes;
 wherein the dyad has a formula that is and wherein the depositing of the dyad includes deposition of a polymer formed of the dyad as a monomer unit.

8. A method comprising:
 depositing a first electrode;
 forming a photoactive layer with a donor and an acceptor by depositing a dyad having a first moiety linked by a chemical bond to a second moiety, wherein arrangement and interspacing of the donor and the acceptor relative to one another is controlled once deposited by cleaving the chemical bond of the dyad between the first moiety that provides the donor and the second moiety that provides the acceptor; and
 depositing a second electrode to provide a photovoltaic cell with the photoactive layer disposed between the first and second electrodes;
 wherein the dyad has a formula that is and further comprising synthesizing the dyad by esterification of anthracen-2-ylmethanol and 2-(thiophen-3-yl)acetic acid to provide an intermediate that is Diels-Alder coupled to a fullerene.

9. A compound having a formula that comprises:

10. The compound according to claim 9, wherein the formula is a repeating monomer unit in a polymer.

11. A device comprising:
 a first electrode;
 a second electrode; and
 a photoactive layer with a controlled arrangement and interspacing of a donor and an acceptor relative to one another disposed between the first and second electrodes to provide a photovoltaic cell, wherein the controlled arrangement and interspacing is based on separation at a cleaved chemical bond, which before cleavage linked within a dyad a first moiety that provides the donor with a second moiety that provides the acceptor; and
 wherein the dyad has a formula that is

* * * * *